(12) United States Patent
Kemmer et al.

(10) Patent No.: US 6,184,562 B1
(45) Date of Patent: Feb. 6, 2001

(54) STRIP DETECTOR

(75) Inventors: Josef Kemmer, Am Isarbach 30, 85764 Oberschleibheim; Gerhard Lutz, Munich; Rainer Richter, Munich; Lothar Struder, Munich; Ladislav Andricek, Munich; Thomas Gebhart, Murnau, all of (DE)

(73) Assignees: Max-Planck-Gesellschaft Zur, Munich; Josef Kemmer, Oberschleibheim, both of (DE)

( * ) Notice: Under 35 U.S.C. 154(b), the term of this patent shall be extended for 0 days.

(21) Appl. No.: 09/171,677
(22) PCT Filed: May 20, 1997
(86) PCT No.: PCT/DE97/01015
  § 371 Date: May 3, 1999
  § 102(e) Date: May 3, 1999
(87) PCT Pub. No.: WO97/44831
  PCT Pub. Date: Nov. 27, 1997

(30) Foreign Application Priority Data
May 20, 1996 (DE) ................................. 196 20 081
(51) Int. Cl.[7] ......................... H01L 29/78; H01L 33/00
(52) U.S. Cl. ........................................ 257/461; 257/336
(58) Field of Search ..................... 257/461, 336

(56) References Cited

U.S. PATENT DOCUMENTS 5,119,152 * 6/1992 Mizuno .

FOREIGN PATENT DOCUMENTS 4-206780 * 7/1992 (JP) .

* cited by examiner

Primary Examiner—Stephen D. Meier
(74) Attorney, Agent, or Firm—Staas & Halsey LLP

(57) ABSTRACT

A strip detector for detecting ionizing particles and/or radiation, consisting of a silicon substrate which, at least on one substrate surface thereof, provides for n-doped zones spaced from each other as strips and voltage supply regions as well as a p-doped isolation zone between the n-doped zones, and including a first isolator layer as well as metal strips disposed above the n-doped zones, wherein immediately above the first isolated layer there is at least one further isolator layer provided and that at least one of the isolator layers is discontinuous in its projection above the intermediate zone of the two adjacent n-doped zones, and wherein the p-doped isolation zone presents a lateral distribution of concentration of the p-type doping material such that in the zone below the discontinuity of the discontinuous isolator layer, a higher concentration of doping material is present than in the isolation regions immediately adjacent to the n-doped zones.

12 Claims, 2 Drawing Sheets

STRIP DETECTOR

FIELD OF THE INVENTION

The invention relates to a strip detector for detection of ionising particles and/or radiation, as well as to a method aiming at the manufacture of the detector. The strip detector comprises a silicon substrate which, at least on one substrate surface, provides n-doped regions spaced from each other as strips and voltage supply regions, as well as a p-doped insulating region between the n-doped region Moreover, the detector comprises a first insulating layer as well as metal strips on a substrate surface, which are disposed above the n-doped regions.

PRIOR ART

Silicon strip counters serve to detect ionising particles and radiation as part of physical experiments and in other detectors. The functional principle is based on diodes arranged in the form of strips which are capacitively coupled or connected directly to amplifiers sensitive to charges. The spacing of the strips and their width in combination with the selection of the read-out mode define the spatial resolution of the detector. The semiconductor substrate is very highly ohmic so that moderate voltages are sufficient to deplete the entire silicon wafer throughout its thickness. As a result a high conversion length is achieved for the incident particles or radiation and hence a high signal at a comparatively low detector capacitance.

The semiconductor substrate may be weakly n- or p-doped. The strips as such commonly consist of highly doped regions. They may be either p- or n-doped, with the rear large-area electrode being required to be of the respectively opposite doping type. In double-side strip counters the strips of an opposite type of doping. Using an inclination of the strips of both sides relative to each other, a spatial resolution in the x- and y-directions is obtained.

Another possibility of distinction for strip counters consists in the manner in which the signal is coupled to the electronic read-out system. In a simple form the diodes, arranged in strip form, are connected to the inputs of the electronic amplifiers, either directly or via externally interposed capacitors. They are therefore referred to as directly coupled strip counters. In a capacitively coupled strip counter the capacitors are integrated into the strip counter. To this end the capacitor is utilised which is formed by the highly doped strip-shaped region, an insulating layer as dielectric material (e.g. silicon oxide) and a metal strip. Such a typical capacitively coupled strip counter is illustrated as prior art in FIG. 2. In p-doped strips such as those drawn as obliquely hatched regions at the upper substrate surface in FIG. 2, the electrical insulation is provided by positive oxide charges which are fixed substantially at the interface between the silicon substrate material—in the embodiment according to FIG. 2 the substrate material is provided with an n-type doping—and the silicon dioxide ($SiO_2$) serving as insulating layer, and which are created during the actual oxidation process. As a result, the formation of parasitic hole channels, which would short the strips, is suppressed. The strip detector, which is processed on two opposite sides according to FIG. 2, includes metal strips MS for signal take off, which are each disposed above correspondingly doped regions. Amplifiers A are connected to the metal strips. Voltage supply contacts Sp are provided for voltage supply and for maintaining appropriate electric fields within the detector structure, via which contacts the biasing voltage±Vbias is applied.

When, for instance, n-type strips also used in double-sided detectors—as is the case in the illustration according to FIG. 2, cf. lower substrate surface—the aforementioned positive oxide charge induces an electron layer which would short-circuit the n-regions, in the regions between the n-doped regions of the n-strips below the contacts ms, the supply voltage contacts intermediate rings MSS at the detector edge, for reducing the supply voltage in a direction towards the detector edge. In order to prevent this, the detector surface is p-doped in the intermediate regions (p-comp).

Two variants have been generally accepted. By means of a photoresist mask applied during implantation the p-layer may remain restricted to the regions between the n-type layers. The process is referred to as "blocking isolation" in English literature. This technique has been described already in the following contributions: J. Sedlmeir, diploma thesis submitted to the Technical University of Muenchen, 1985, and G. Lutz et al., MPI-PAE/Exp. El. 175, 1987, as well as G. Lutz, p, 195, New York: Plenum, 1988. Concerning this, FIG. 3a illustrates a detector detail which is provided with n-doped regions in the substrate surface, with implantation of an insulating p-region 2 in the intervals therebetween so as to avoid short circuits. An insulator layer 3, e.g. silicon oxide, is applied directly on the substrate surface, which includes the oxide charges. Metal strips 4 are provided for signal take off above the n-doped regions.

Another possibility consists in the implantation of the p-layer 2 without any mask, wherein it is over-compensated by the n-regions 1 which are more highly doped (cf. in this respect FIG. 3b in the following where the same reference numerals as in FIG. 3a are used). This is referred to as "spray isolation" and is described, for instance, in an article by J. Kemmer and G. Lutz in Nucl. Instr. and Meth. A 326, p. 209, 1993.

Both possibilities involve advantages and disadvantages. In accordance with their object, strip detectors are frequently employed in a radiation-loaded environment. lonising radiation and particles of high energy, however, damage the semiconductor material, so that the properties of the detector are degraded in the course of time.

Two types of damage can be roughly distinguished from each other.

An irradiation of the detector surface causes an increase of the defects in the zone of the interface between the silicon and the $SiO_2$ material, and hence an increase of the oxide charges. This effect begins already at comparatively low radiation doses. The size of the generated oxide charges reaches saturation, however, at higher doses. During irradiation with particles, defects are created even in silicon itself. The radiation induces a strongly increased leakage current and a change of the doping in the semiconductor substrate, with a change of the type of doping in the semiconductor from n to p (type inversion)., which creates an entirely new field distribution within the component. This effective p-type doping continues to increase in the course of irradiation and results in strongly increased depletion voltages and hence in higher operating voltages.

Both types of damage, i.e., the increase of the oxide charges and the inversion of he doping type to the p-type, cause an increase of the strength of the electric field in the zone 5, identified in FIG. 3a with "blocking isolation". This means that the breakdown voltage is reduced as the irradiation is increased. Hence there is a conflict between the required increase of the operating voltage and the reduced breakdown voltage.

Another problem resides in the aspect that specifications and tests inevitably relate to non-irradiated detectors. As, however, the breakdown characteristics are deteriorated in the course of operation, a reliable statement about the suitability of the measured detector cannot be derived from measurements performed on a non-irradiated component. Moreover, in a system the replacement of defective detectors often incurs substantial expenses because of complicated assembly techniques. This problem does not arise with "spray isolation". The maximum of the electric field is located in this case directly at the junction between the n-region and the p-insulating region. Cf. in this respect the zones 5 in FIG. 3b. The height of this maximum is determined by the difference in concentration and by the steepness of the pn-junction (doping gradient) as well as by the applied voltage. Irradiation and the accompanying increase of the oxide charge, cause a portion, of the p-doping (negative acceptor residues) to be compensated by the positive oxide charge, with a reduction of the lateral electric field.

The breakdown voltage is increased as the density of the oxide charges is increased. In a non-irradiated detector the highest electric fields occur so that even the worst conditions may be tested. The problem involved in this insulating structure resides in an appropriate selection of the doping concentration which must be so high that the oxide charge increase to be expected may be compensated, but which must, not be so high that the breakdown voltage is too low from the very beginning. The saturation valve of the density of oxide charges, to which the doping concentration must be suited, depends on the electric field in the oxide during irradiation and presumably on the quality of the $SiO_2$ material in the initial state, i.e. on the processing. As one cannot precisely predict which saturation value will occur, the doping concentration should be set with a sufficient safety margin, which renders the problem even more acute.

In conclusion it may be stated that presently there is no n-type lateral insulating structure which would satisfies all the demands in irradiated detectors.

The requirement of a high strip yield has a highly cost-inflating effect specifically in the manufacture of capacitively coupled strip counters. The great number of the strips and the size of the detectors (up to roughly 40 $cm^2$) result in the situation that often a substantial number of the strips are short circuited with the implanted strips therebelow so that either the channel can no longer be read out or a current is injected from the electronic system into the detector. These short circuits are created by holes in the insulating layer, which are mainly created by insufficient masking during the process of etching this insulating layer when the contact windows are opened. The application of a second insulating layer is a remedial measure, which second layer is structured in a second lithographic step. In this process the fact is utilised that a coincidence of defects in both insulating layers at one position is highly improbable. This double insulating technique presents a disadvantage in necessitating the application of a additional lithographic step, which, in turn, increases the production costs even more strongly, without achievement of a gain in performance.

BRIEF DESCRIPTION OF THE INVENTION

The invention is based on the problem of improving a strip detector in accordance with the introductory clause of claim 1 in such a way that the aforementioned disadvantages related to the voltage breakdown characteristics may be largely precluded. Moreover, the durability should be enhanced and the production costs reduced. In particular, it should become possible to operate silicon strip counters with n-doped strips at high voltages in a radiation-loaded environment and to manufacture them with a higher yield.

In accordance with the invention a strip detector for detection of ionising particles and/or radiation, comprising a silicon substrate provided, at least on one substrate surface, with n-doped regions spaced from each other as strips and voltage supply regions, as well as with a p-doped insulating region between the n-doped regions, a first insulating layer applied on a substrate surface as well as metal strips disposed above the n-doped regions, is improved in such a way that directly above the first insulating layer at least one further insulating layer is provided, and that at least one of said insulating layers is discontinuous at a portion above a zone intermediate between two adjacent n-doped regions, and that the p-doped insulating region has a lateral distribution of concentration of the p-type doping material such that in the zone below the discontinuity of the discontinuous insulating layer a higher concentration of doping material is present than in the insulating zones directly adjacent to the n-doped regions.

The essential aspect of the invention resides in the three-dimensional distribution of the maximum strength of the electric field in the transitional zone between the highly doped n-regions and the p-type insulating regions, with the production of these detectors being possible at a low-cost level.

BRIEF DESCRIPTION OF THE DRAWING

The invention will be described in the following in an exemplary explanation of embodiments, without any restriction of the general inventive idea, with reference to the drawing wherein:

In the following Figures the same or similar parts are identified by the same reference numbers so that a repeated description is dispensed with here.

FIGS. 2 and 3a, b have been described already in the foregoing in relation to prior art, so that they will no longer be discussed in the following.

The invention is described here with reference to an embodiment. First the respective technological process will be explained which results in the inventive structure. Then the characteristics of the structure will be described with reference to the advantageous process control.

Figure 1:
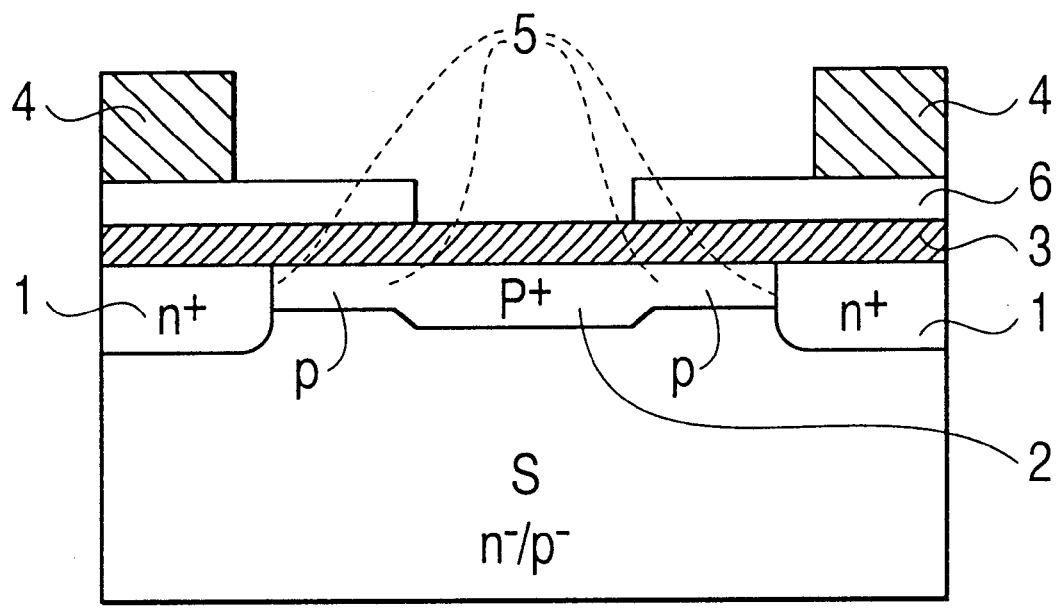
FIG. 1 is a cross-sectional view taken through a strip detector configured in accordance with the invention.
Figure 2:
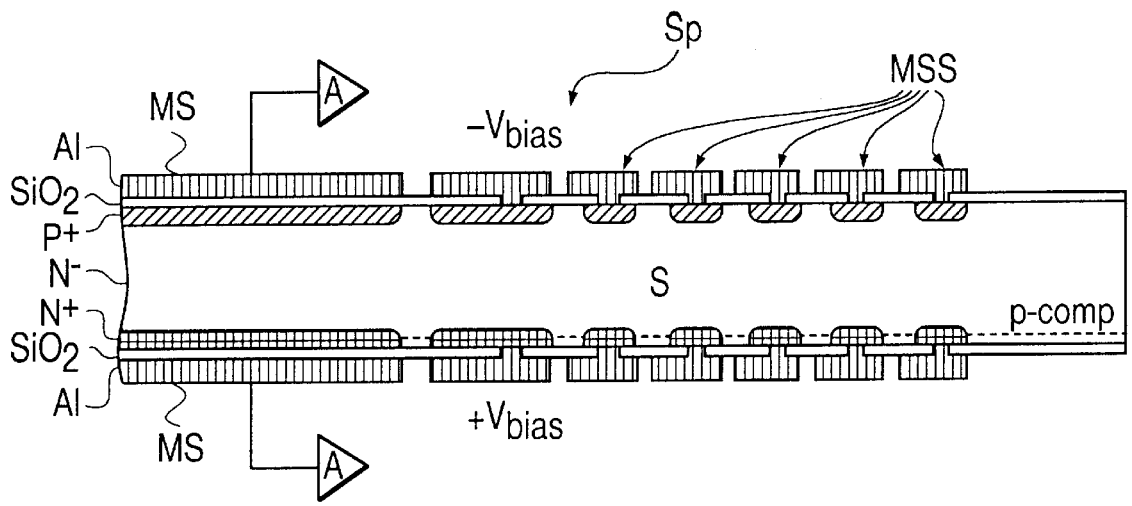
FIG. 2 illustrates a known strip detector with a double-sided structure.
Figure 3A:
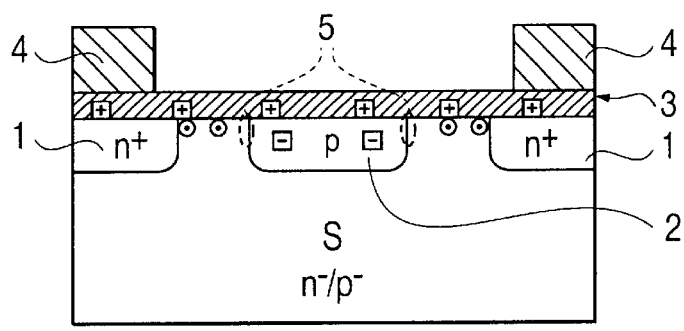
FIGS. 3a, b show known strip detectors produced with "blocking isolation" (FIG. 3a) and "spraying isolation"0 (FIG. 3b).
Figure 3B:
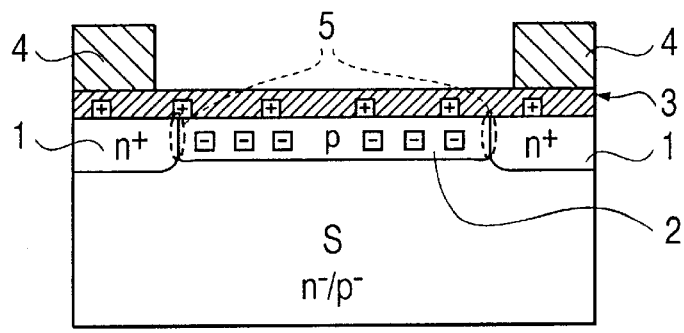

Processing of the strip detector illustrated in FIG. 1 begins with the thermal oxidation of the silicon substrate S which may have only a very low doping level so as to allow a large spread of the barrier zones. The specific resisitivity of the silicon substrate S should be within the range of 1 kΩcm or higher. It is not decisive for the invention whether the semiconductor substrate S has a weak n-type or a weak p-type doping. The thickness of the grown oxide layer 3 (1st insulating layer) may be within the range of 200 nm. Substantial deviations from this value are well possible. After the oxidation a photoresist mask is applied which is opened to the regions to be implanted subsequently. It is expedient to etch the oxide 3 slightly in the region of the opened photoresist mask in order to create register marks for the adjustment of the following lithographic masks. The n-regions 1 are implanted with a comparatively high dose in the range of 1015 $cm^{-2}$ and with an implantation energy which must be so set that a substantial part of the implanted ions penetrates through the silicon oxide 3. With the selected thickness of the layer, and when phosphorus is used, this energy ranges at 180 keV. Following the implantation a thermal treatment may be performed for electrical activation of the implant and for achieving a diffusion of the doping material into the subrate. Then a silicon nitride layer 6 (2nd insulating layer) is deposited with a thickness of roughly 100 nm. This layer is so structured that openings are preserved in the position of contact of the metal, to be applied subsequently, with the n-doped regions and in the area above the p-doped region between the n-doped regions which should be insulated from each other.

In a next step the p-type insulating region 2 is implanted with boron ions. The implantation parameters (energy and dose) must be so adjusted that a noticeably higher boron dose will be implanted in the silicon material S below the area of the opened silicon nitride layer 6 than in the covered material (proposed implantation parameters with these layer thickness values: energy 80 keV, dose $7 \times 10^{12}$ cm$^{-2}$).

Finally, contact windows (not shown) are opened in the silicon oxide layer 3 and a metallizing with aluminium and structuring of the metal is performed.

The application of a second plane of conductive strips and/or a passivation layer are optional. Because of the stepped boron dose in the silicon material S it is possible to keep the electric fields in the transitional zone 5 between the n-doped regions 1 and the p-insulating layer 2 low, whilst at the same time the doses may be so increased in the intermediate region that a reliable insulating of the n-type layers 1 will be ensured even after an increase of the oxide charges. Compared with prior art and the double insulating technique proposed there, this inventive technology does not require any further expenditure in terms of additional technology. The opening of the contact windows in the silicon dioxide material may be protracted and performed, for instance, immediately upon thermal oxidation.

The inventive configuration of the strip detector can, of course, also be employed for directly coupled strip counters. In such a case the double insulating technique is, however, not required for an increase of the strip yield as it does not affect the improvement of the breakdown characteristics.

The inventive isolation structure is also suitable to isolate protective rings—cf. in this respect the contribution by A Bischof et al., published in Nucl. Instr. and Meth. A326, p. 27, 1993—which gradually reduce the high operating voltage in a direction towards the detector edge. It insulates adjacent rings from each other, which extend around the entire detector, so that different potentials may be established thereon at low strengths of the electric field. In some embodiments of strip counters bias structures are provided on the face side of the implanted strips, which transfer the voltage from the voltage supply zones to the strips, making use of the punch-through effect. This bias mechanism may also be employed in n-type doped strips. The insulation on the surface can also be achieved with inventive insulating structures. As a result, a simple solution compatible with technology is provided for the insulation of all structures required for the operation of an n-side strip counter, such as strips, bias structures and protective rings.

What is claimed is:

1. A strip detector to detect ionizing particles and/or radiation, comprising a silicon substrate having a first surface, a plurality of n-doped regions spaced from each other as strips and voltage supply regions on said first surface, a plurality of p-doped regions on said first surface and alternating between said n-doped regions, a first insulating layer on said plurality of n-doped regions and said p-doped regions, and metal strips disposed on said first insulating layer to be above said n-doped regions and insulated by said first insulating layer from said n-doped regions, wherein at least one further insulating layer is provided directly on said first insulating layer, and at least one of said further insulating layers is a discontinuous insulating layer having a discontinuity at a position located above an intermediate zone of one of said p-doped region between two of said n-doped regions, such that said discontinuous insulating layer covers lateral areas of said intermediate zone, and said p-doped regions, having been formed by a homogeneous large-area implantation following a deposition of said further insulating layer, has a distribution of a concentration of a p-type doping material along a lateral direction of said strip detector such that the concentration of said doping material in said intermediate zone below the discontinuity of the discontinuous insulating layer is higher than in the zones of said p-doped region directly bordering on said n-doped regions.

2. A strip detector according to claim 1,
wherein the discontinuity in said discontinuous insulating layer is located centrally above said intermediate zone.

3. A strip detector according to claim 1,
wherein at least one of said metal strips is connected to at least one of said n-doped regions.

4. A strip detector according to claim 1,
wherein at least one of said metal strips is insulated from said n-doped regions by at least one of said further insulating layers.

5. A strip detector according to claim 1,
wherein a concentration of p-type doping material in zones of said p-doped regions directly bordering on said n-doped regions is the same as in the n-doped regions, but is less than a concentration of n-type doping material in said n-doped regions.

6. A strip detector according to claim 1,
wherein said first insulating layer comprises silicon oxide.

7. A strip detector according to claim 1,
wherein at least one of said further insulating layers comprises a material other than a material of said first insulating layer.

8. A strip detector according to claim 7,
wherein said at least one further insulating layer comprises silicon nitride.

9. A strip detector comprising:

a substrate;

a plurality of n-doped regions on said substrate;

a p-doped region between said n-doped regions;

an insulating layer above said n-doped regions and said p-doped region, said insulating layer forming a discontinuity;

said p-doped region further comprises an intermediate zone below said discontinuity formed by said insulating layer, and a lateral zone not below said discontinuity, wherein a concentration of p-type doping material in said intermediate zone is higher than a concentration of p-type doping material in said lateral zone.

10. The strip detector of claim 9, wherein said substrate comprises weak n-type doping, and said n-doped region comprises strong n-type doping.

11. The strip detector of claim 10, wherein said substrate further comprises weak p-type doping.

12. The strip detector of claim 11, wherein a level of n-type doping in said n-doped regions is approximately $10^{15}$ cm$^{-2}$.

* * * * *